(12) United States Patent
Zhu et al.

(10) Patent No.: US 8,367,490 B2
(45) Date of Patent: Feb. 5, 2013

(54) SEMICONDUCTOR STRUCTURE AND METHOD FOR MANUFACTURING THE SAME

(75) Inventors: Huilong Zhu, Poughkeepsie, NY (US); Qingqing Liang, Beijing (CN); Haizhou Yin, Poughkeepsie, NY (US); Zhijiong Luo, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 69 days.

(21) Appl. No.: 13/144,182

(22) PCT Filed: Mar. 4, 2011

(86) PCT No.: PCT/CN2011/071530
§ 371 (c)(1),
(2), (4) Date: Jul. 27, 2011

(87) PCT Pub. No.: WO2012/055201
PCT Pub. Date: May 3, 2012

(65) Prior Publication Data
US 2012/0104495 A1    May 3, 2012

(51) Int. Cl.
*H01L 27/12* (2006.01)
*H01L 21/84* (2006.01)

(52) U.S. Cl. . 438/157; 257/347; 257/401; 257/E21.409; 257/E21.623; 438/151; 438/283; 438/300; 438/176; 438/739

(58) Field of Classification Search .................. 257/347, 257/401, E21.409, E21.623; 438/151, 157, 438/283, 300, 176, 739
See application file for complete search history.

(56) References Cited

U.S. PATENT DOCUMENTS

| | | | |
|---|---|---|---|
| 2005/0037582 A1* | 2/2005 | Dennard et al. | 438/281 |
| 2007/0018246 A1 | 1/2007 | Kato et al. | |
| 2008/0182380 A1 | 7/2008 | Oka | |
| 2009/0212362 A1* | 8/2009 | Cheng et al. | 257/347 |

FOREIGN PATENT DOCUMENTS

CN    1901228 A    1/2007

OTHER PUBLICATIONS

International Search Report and Written Opinion of the State Intellectual Property Office of China in foreign counterpart Application No. PCT/CN2011/071530, dated Jul. 28, 2011.

* cited by examiner

*Primary Examiner* — Julio J Maldonado
*Assistant Examiner* — Maria Ligai
(74) *Attorney, Agent, or Firm* — Kinney & Lange, P.A.

(57) ABSTRACT

The present application discloses a semiconductor structure and a method for manufacturing the same. The semiconductor structure according to the present invention adjusts a threshold voltage with a common contact, which has a portion outside the source or drain region extending to the back-gate region and provides an electrical contact of the source or drain region and the back-gate region, which leads to a simple manufacturing process, an increased integration level and a lowered manufacture cost. Moreover, the asymmetric design of the back-gate structure further increases the threshold voltage and improves the performance of the device.

18 Claims, 7 Drawing Sheets

SEMICONDUCTOR STRUCTURE AND METHOD FOR MANUFACTURING THE SAME

CROSS REFERENCE TO RELATED APPLICATION(S)

This application is a Section 371 National Stage Application of International Application No. PCT/CN2011/071530 filed on Mar. 4, 2011, which claims priority to Chinese Application No. CN 201010527488.5 filed Oct. 27, 2010, the entire contents of which are incorporated herein by reference in their entirety.

FIELD OF INVENTION

The present invention relates to semiconductor technology, and more particularly, to a semiconductor-on-insulator (SOI) metal oxide semiconductor field effect transistor (MOSFET) structure and a method for manufacturing the same.

DESCRIPTION OF RELATED ART

A complementary metal oxide semiconductor transistor has an increasingly decreasing gate pitch so as to provide improved efficiency and lowered manufacturing cost in very large scale integrated circuits. However, reduction of gate pitch may lead to short channel effects, which deteriorate performance of the device.

In SOI technology, devices and circuits are formed on a silicon film of an insulating layer. Due to the existence of a buried oxide layer, the devices are completely isolated from each other. Thus, the SOI-CMOS integrated circuits intrinsically avoids the latch up effect of a bulk silicon CMOS. Moreover, a fully depleted SOI (FD-SOI) device may form a shallow junction and has a relatively smaller leakage current due to its relatively smaller short channel effect. Thus, the fully depleted SOI MOSFET having an ultra-thin body and a double gate attracts a great deal of attention. A grounded SOI layer is formed below an ultra-thin buried oxide layer in an SOI MOSFET for adjusting the threshold voltage and suppressing the short channel effect. However, the conventional process requires additional contacts and wirings, which may lead to increase of the area occupied by the device.

In view of the above problems, there still needs a novel semiconductor structure and a method for manufacturing the same having a tunable threshold voltage and a reduced device size.

SUMMARY OF THE INVENTION

The object of the present invention is to provide a semiconductor structure and a method for manufacturing the same for solving the above problems in the prior art. According to one aspect of the invention, there is provided a semiconductor structure, comprising:

an SOI substrate, comprising an SOI layer, a first buried insulating layer, an additional SOI layer, a second buried insulating layer and a base substrate from top to bottom;

a shallow trench isolation structure embedded in the SOI substrate and located above the second buried insulation layer to provide an active region;

a gate formed in the active region;

source/drain regions on both sides of the gate;

a back-gate region formed from the additional SOI layer by reducing resistance, comprising at least a portion of the additional SOI layer below the source/drain regions and the gate; and a contact having a portion outside the source or drain region which extends to the back-gate region to provide a common electrical contact between the source or drain region and the back-gate region.

Preferably, a portion of the additional SOI layer below the drain or source region is formed as an isolating dielectric filling region.

Preferably, the portion of the contact outside the source or drain region is formed in the shallow trench isolation structure and contacts one side surface of the back-gate region.

Preferably, the semiconductor structure comprises raised source/drain regions on the source/drain regions.

In one embodiment of the present invention, the first buried insulating layer, and the second buried insulating layer are preferably buried oxide layers.

According to another aspect of the invention, there is provided a method for manufacturing a semiconductor structure, comprising:

providing an SOI substrate which comprises an SOI layer, a first buried insulating layer, an additional SOI layer, a second buried insulating layer and a base substrate from top to bottom;

forming a shallow trench isolation structure embedded in the SOI substrate and located above the second buried insulation layer to provide an active region;

forming a back-gate region by reducing resistance of the additional SOI layer;

forming a gate and source/drain regions on both sides of the gate on the SOI substrate in the active region;

wherein the back-gate region comprises at least a portion of the additional SOI layer below the source/drain regions and below the gate;

forming a contact having a portion outside the source or drain region which extends to the back-gate region to provide a common electrical contact between the source or drain region and the back-gate region.

In one embodiment of the present invention, the first buried insulating layer, and the second buried insulating layer are preferably buried oxide layers.

Preferably, the step of reducing resistance of the additional SOI layer comprises performing n-type or p-type doping with a doping concentration of $10^{18}$-$10^{21}$ cm$^3$.

Preferably, a portion of the additional SOI layer below the source or drain region is formed as an isolating dielectric filling region and adjacent to the back-gate region.

Preferably, the step of forming the isolating dielectric filling region comprises:

performing n-type heavily doping to a portion of the additional SOI layer before formation of the shallow trench isolation structure;

forming a shallow trench isolation structure to expose one side of the n-type heavily doped region;

removing the n-type heavily doped region; and filling with an isolating dielectric.

Preferably, the step of performing n-type heavily doping comprises performing Ion implantation with As or P.

Preferably, the doping concentration is large than $10^{18}$ cm$^{-3}$.

Preferably, the portion of the contact outside the source or drain region extends into the shallow trench isolation structure, which contacts one side surface of the back-gate region.

Preferably, the step of forming the contact which contacts one side surface of the back-gate region comprises:

forming a contact hole which has a portion extending into the shallow trench isolation structure to expose one side surface of the back-gate region;

filling the contact hole with a conductive material; and performing a planarization process.

Preferably, the conductive material is one selected from a group consisting of W, Al, Cu, TiAl, and combinations thereof.

Preferably, a liner is formed before filling with the conductive material.

Preferably, the material of the liner is one selected from a group consisting of Ta, TaN, Ti, TiN, Ru, and combinations thereof.

Preferably, raised source/drain regions are formed on the source/drain regions.

The semiconductor structure adjusts a threshold voltage with a common contact, which leads to a simple manufacturing process, an increased integration level and a lowered manufacture cost. Moreover, the asymmetric design of the back-gate structure further increases the threshold voltage and improves the performance of the device.

DETAILED DESCRIPTION OF PREFERRED EMBODIMENTS

Figure 1:
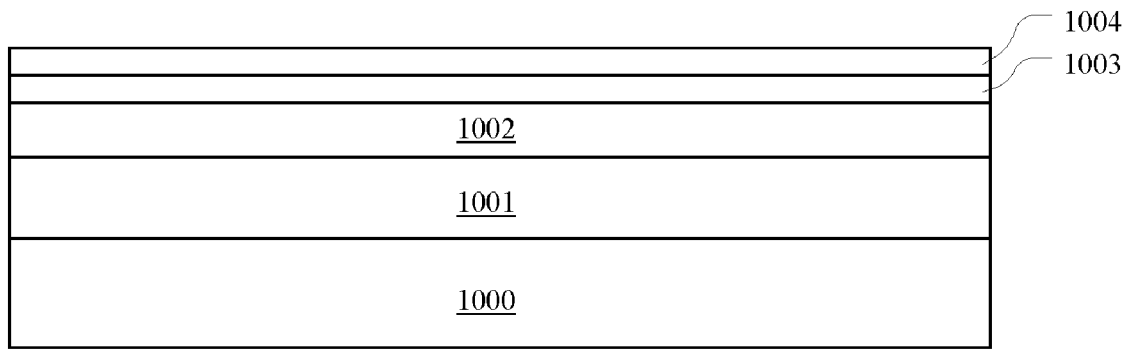
FIG. 1 is a cross-sectional view of an SOI substrate in a method for manufacturing a semiconductor structure according to an embodiment of the present invention.

The embodiments of present invention will be described below in detail in connection with attached drawings. The same reference numerals are used throughout the figures to indicate the same or similar part or the part having the same or similar functions. The embodiments described below in connection with the attached drawings are only illustrative for explaining the present invention, and are not construed as limiting the invention.

The disclosure below provides various embodiments or examples for carrying out the technical solution of the present invention. Although the parts and arrangements of some specific examples are described, the parts and arrangements are only given as examples, and are not construed as limiting the present invention.

Moreover, the invention provides various specific processes and/or materials. Nevertheless, one skilled person in the art will appreciate that other processes and/or materials can also be used as alternatives without departing from the protection scope of the invention. Note that the relations of various structures described herein include necessary extensions introduced by the process.

FIGS. 1-10 illustrate various steps in the method for manufacturing the semiconductor structure according to an embodiment of the present invention. The various steps in the method for manufacturing the semiconductor structure according to the embodiment of the present invention, and the resultant semiconductor structure will be described below in detail in connection with the attached drawings.

Firstly, a silicon-on-insulator (SOI) substrate is provided, which specifically comprises an SOI layer 1004, a first buried oxide layer 1003, an additional SOI layer (for example, a polysilicon layer) 1002, a second buried oxide layer 1001, and a base substrate 1000, as shown in FIG. 1. The SOI layer can be made, but not limited to, one of Si, SiGe, SiC, and SiGeC, or any combination thereof. The second buried oxide layer 1001 can also be other buried insulating layers.

The SOI substrate can be manufactured with a conventional Separation by Ion Implantation of Oxygen (SIMOX) process such as thermal bonding and cutting or other conventional processes which are well known by one skilled person in the art. Thickness of layers of an SOI wafer can be varied by the manufacture process. Typically, the SOI layer 1004 has a thickness of about 5-30 nm, the first buried oxide layer 1003 has a thickness of about 2-25 nm, the additional SOI layer 1002 has a thickness of about 10-50 nm, and the second buried oxide layer 1001 has a thickness of about 60-200 nm. The above thicknesses are only illustrative, and are not construed as limiting the present invention. The first buried oxide layer 1003 can also be other buried insulating layers.

Figure 2:
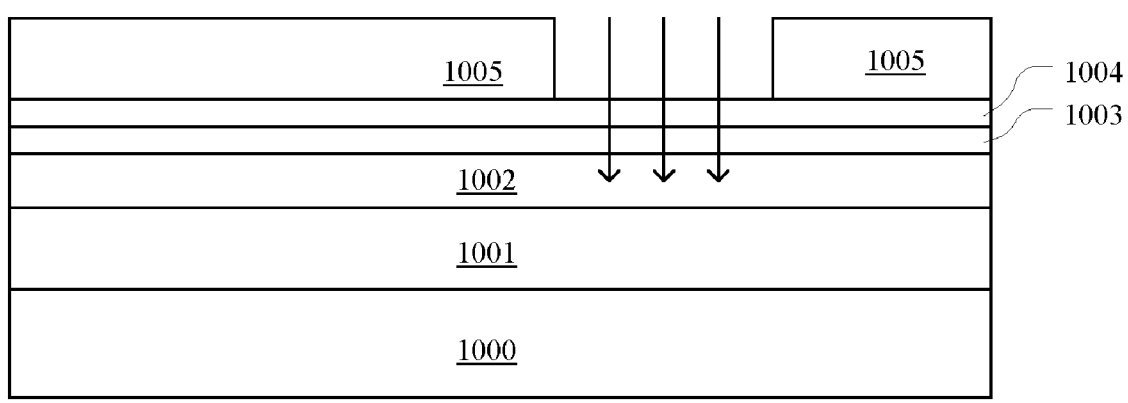
FIG. 2 is a cross-sectional view which illustrates performing n-type heavily doping to the additional SOI layer with the photoresist as a mask in the method for manufacturing the semiconductor structure according to the embodiment of the present invention.
Figure 3:
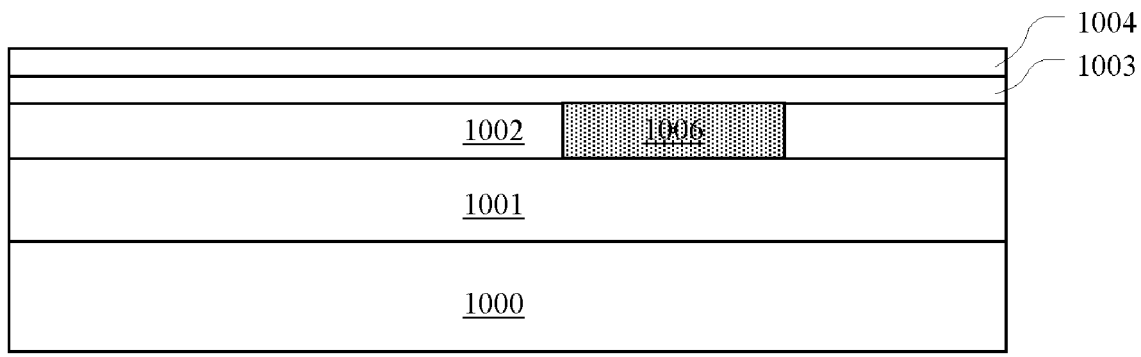
FIG. 3 is a cross-sectional view of the structure after removing the photoresist and performing annealing to activate the implanted ions in the method for manufacturing the semiconductor structure according to the embodiment of the present invention.

A back-gate region is then formed. In the embodiment of the present invention, photoresist 1005 is firstly provided on the SOI substrate by spin coating, and then patterned to expose a portion of the surface of the SOI substrate. The additional SOI layer in the exposed region is then n-type heavily doped with the photoresist 1005 as a mask, as shown in FIG. 2. In the embodiment of the present invention, an n-type dopant such as As or P is used in the ion implantation. The concentration of the dopants is typically higher than $10^{18}$ cm$^{-3}$. The photoresist is then removed by a conventional process. Annealing is performed to activate the implanted ions so as to form an n-type heavily doped region 1006, as shown in FIG. 3. Preferably, the annealing temperature is in the range of about 800° C. to 1000° C.

Figure 4:
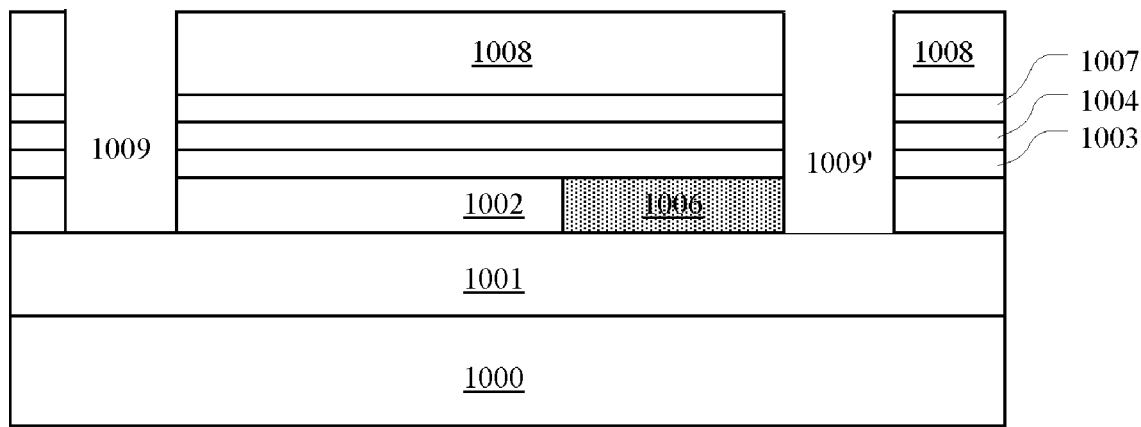
FIG. 4 is a cross-sectional view of the structure after forming trenches for STI structures by a conventional process in the method for manufacturing the semiconductor structure according to the embodiment of the present invention.

The trenches 1009 and 1009' for shallow trench isolation (STI) structures are then formed, and the semiconductor structure shown in FIG. 4 is obtained. For example, a pad oxide layer is formed on the substrate by a conventional process such as APCVD, LPCVD, PECVD, or by thermal oxidation. Process parameters such as flow rate, temperature, pressure and the like can be controlled so as to provide a pad oxide layer 1007 having a predetermined thickness and good quality. The pad oxide layer 1007 in the embodiment has a thickness of about 5-10 nm. A nitride layer 1008 is formed on the pad oxide layer by a conventional deposition process. The nitride layer 1008 has a thickness of 50-120 nm. The pad oxide layer 1007 is used for protecting the underlying substrate structure during etching or other processes. The nitride layer 1008 is used as a mask layer during the subsequent etching for providing STI. STI is then patterned. Photoresist is provided on the nitride layer 1008 by spin coating, and then is exposed and developed for patterning. Shallow trenches are provided by etching, for example, by an anisotropic dry etching process. In the embodiment, the portions of the pad oxide layer 1007 and the nitride layer 1008 at the STI region are preferably etched away completely by reactive ion etching. The SOI substrate is further etched to the second oxide layer 1001, so as to provide an isolation trench. A top surface of the second buried oxide layer 1001 at the STI region and a side surface of the n-type heavily doped region 1006 of the additional SOI layer 1004 are exposed at the isolation trenches 1009 and 1009'. The photoresist is then removed by a conventional process which is well known in the art.

Figure 5:
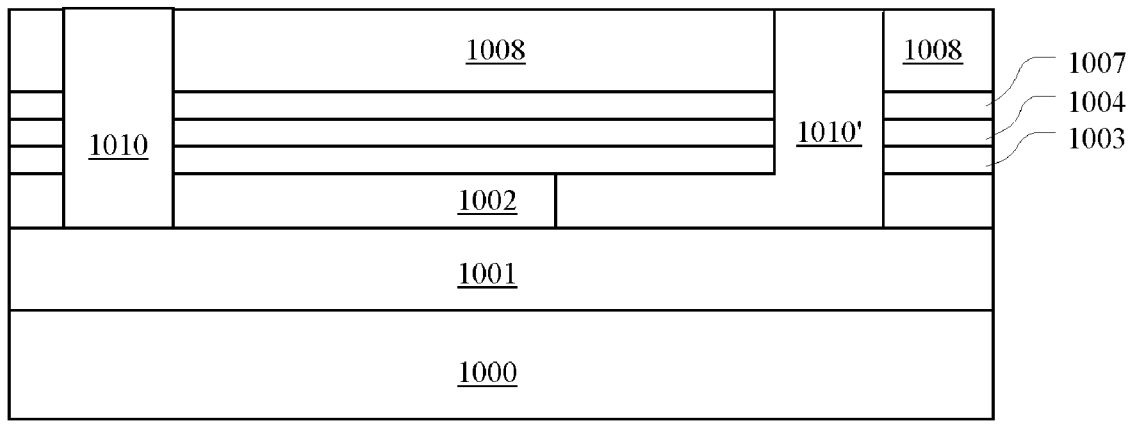
FIG. 5 is a cross-sectional view of the structure after the n-type heavily doped additional SOI layer is selectively etched and filled with isolating dielectric in the method for manufacturing the semiconductor structure according to the embodiment of the present invention.

For undoped or p-type doped silicon, the n-type heavily doped region of the additional SOI layer is then selectively etched to be removed completely, so as to provide asymmetric shallow trenches for the STIs. The trenches are then filled with an isolation dielectric so as to form shallow trench isolation structures 1010 and 1010'. The isolation dielectric can be one of nitrides and nitrides, or any combination thereof. An oxide is used in the embodiment. The STI is then planarized, for example, by performing chemical mechanical polishing (CMP) to remove portions of the oxide layer so that the CMP process stops at the nitride layer 1008. The resultant structure is shown in FIG. 5. The oxide layer is etched back and the nitride layer 1008 is etched away completely.

Figure 6:
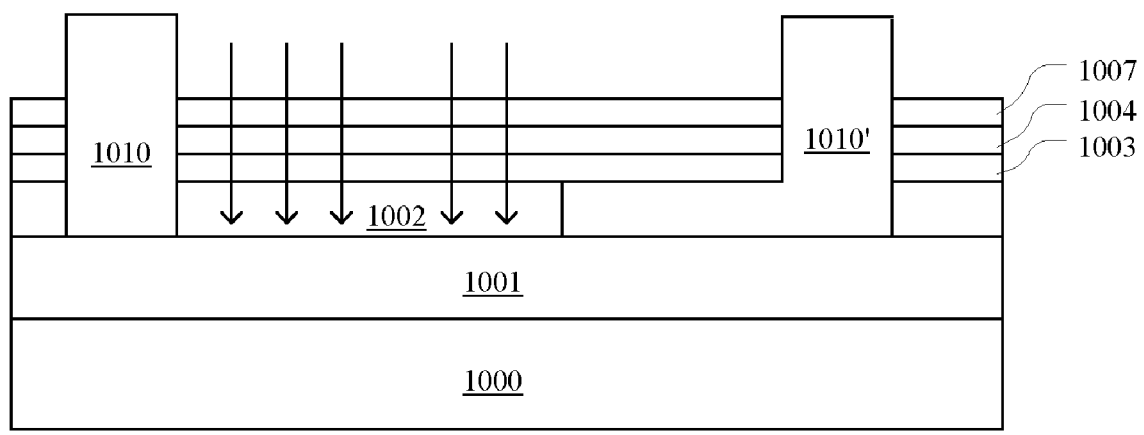
FIG. 6 is a cross-sectional view of the structure after a back-gate region is formed in the method for manufacturing the semiconductor structure according to the embodiment of the present invention.

A back-gate region is then formed. A back-gate region 1011 is formed by reducing resistance of the additional SOI layer 1002, as shown in FIG. 6. An ion implantation process is used in the embodiment of the present invention. The semiconductor structure undergoes n-type doping with ions such as As, P and the like, or p-type doping with ions such as In, B and the like. The doping concentration is typically in the range of about $10^{18}$-$10^{21}$ cm$^{-3}$.

Figure 7:
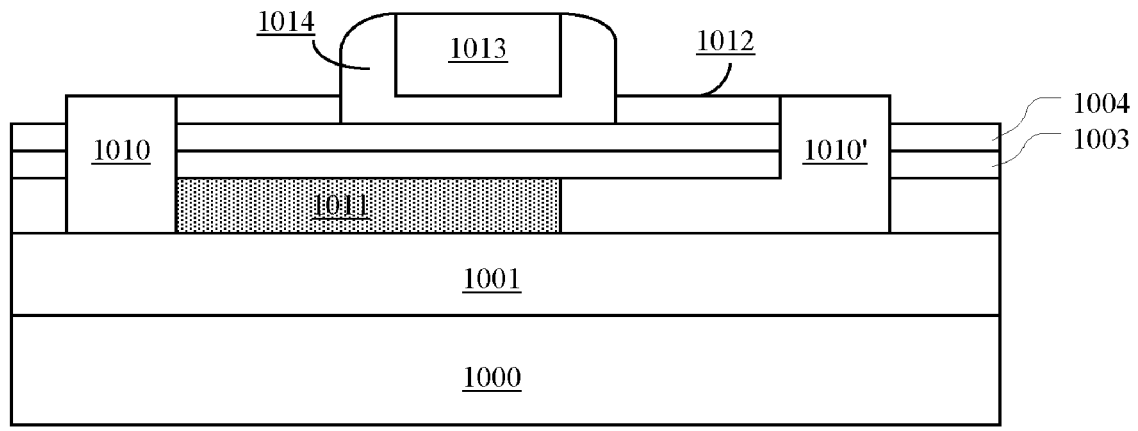
FIG. 7 is a cross-sectional view of the structure after a MOSFET is formed in the method for manufacturing the semiconductor structure according to the embodiment of the present invention.

The pad oxide layer 1007 is then etched away completely, and a MOSFET is formed by a conventional process. The resulting semiconductor structure is shown in FIG. 7. For example, a gate 1013 is formed. Specifically, a gate dielectric layer can be formed by depositing a gate dielectric material which is at least one selected from a group consisting of $HfO_2$, HfSiO, HfSiON, HfTaO, HfTiO, HfZrO, $Al_2O_3$, $La_2O_3$, $ZrO_2$ and LaAlO. A gate conductor layer is then deposited, the material of which is, for example, a metal or a polysilicon. The gate is then patterned. Photoresist is formed on the gate conductor layer by spin coating and is baked at a predetermined temperature. The photoresist is then exposed and developed with the mask having a desired pattern by the gate so as to form a pattern on the oxide layer. The gate conductor layer and the gate dielectric layer are etched. The photoresist is removed by a conventional process. The gate dielectric layer has a thickness of about 1-3 nm, for example, 2 nm, and the gate conductor layer has a thickness of about 50-100 nm, for example, 60 nm, 70 nm, 80 nm, or 90 nm.

Sidewall spacers 1014 are then formed on sidewalls of the gate, and the material of the sidewall spacers may comprise at least one of oxides, nitrides and combinations thereof. An optional process includes depositing an insulating material and then etching to form sidewall spacers of the gate.

After forming the sidewall spacers of the gate, source/drain regions are formed in the silicon layer adjacent to the sidewall spacers by a conventional ion implantation process and a conventional anneal process. Preferably, the source/drain regions are formed in a self-aligned manner.

Preferably, source/drain extensions and halos are also formed. Specifically, the source/drain halos and extensions can be formed by ion implantation so as to suppress the short channel effect. In the ion implantation, the dopants such as As or P are used for providing source/drain extensions for an nMOSFET, and the dopants such as B, $BF_2$, or In are used for providing source/drain extensions for a pMOSFET. In the ion implantation, the dopants such as B, $BF_2$, or In are used for providing source/drain halos for an nMOSFET, and the dopants such as As or P are used for providing source/drain halos for a pMOSFET, followed by a spike annealing at a temperature of about 900-1100° C. so as to activate the dopants in the source/drain regions.

Preferably, raised source/drain regions 1012 may also be formed. Specifically, a layer of epitaxial polysilicon or silicon may be deposited on the source/drain regions, and ion implantation may be performed for doping, followed by annealing for activating the dopants.

Figure 8:
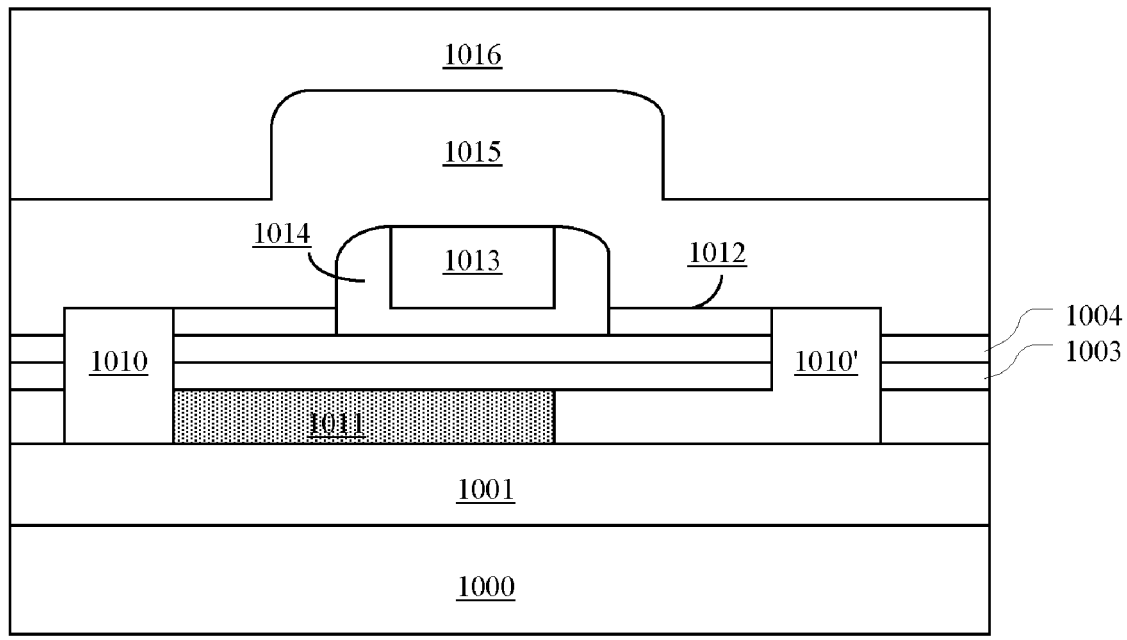
FIG. 8 is a cross-sectional view of the structure after a nitride and an oxide are deposited and the surface is then planarized in the method for manufacturing the semiconductor structure according to the embodiment of the present invention.
Figure 9:
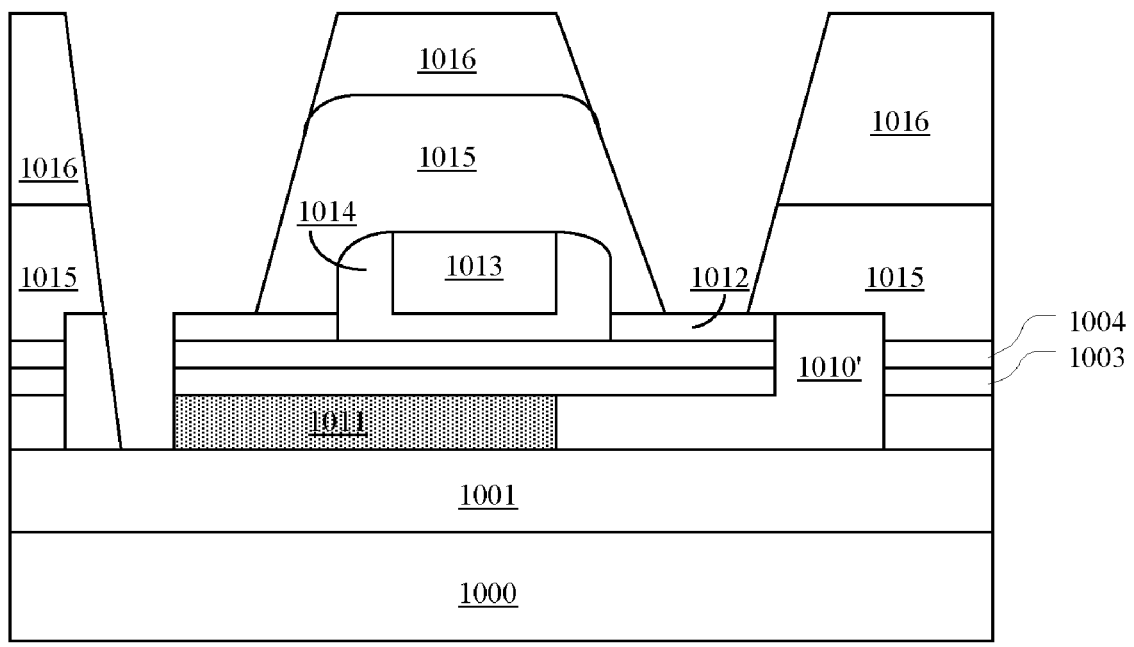
FIG. 9 is a cross-sectional view of the structure after contact holes are formed in the method for manufacturing the semiconductor structure according to the embodiment of the present invention.
Figure 10:
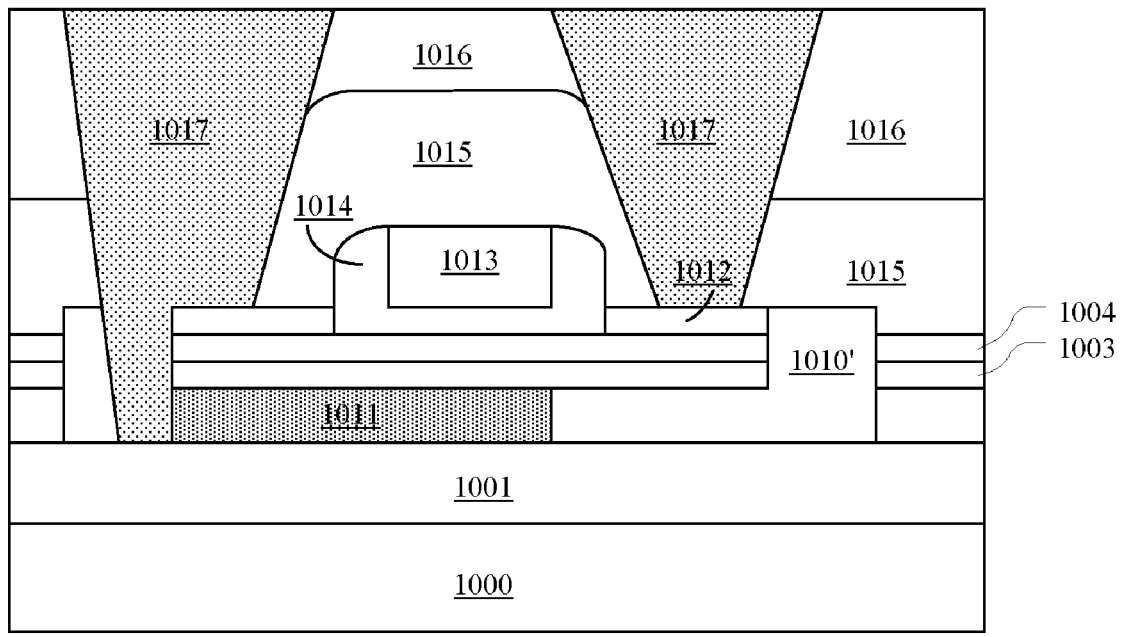
FIG. 10 is a cross-sectional view of the structure after contacts are formed in the method for manufacturing the semiconductor structure according to the embodiment of the present invention.

Then, the process for forming contacts is performed as shown in FIGS. 8-10.

Firstly, upper portions of the raised source/drains and of the gate are converted into silicides by a conventional silicidation process. An insulating layer is formed by depositing and planarizing the formed structure, as shown in FIG. 8. For example, a nitride layer 1015 having a thickness of about 30-100 nm may be deposited, and an oxide layer 1016 having a thickness of 50-300 nm may be deposited on the nitride layer 1015, and then the oxide layer 1016 may be planarized by the CMP process.

Figure 11:
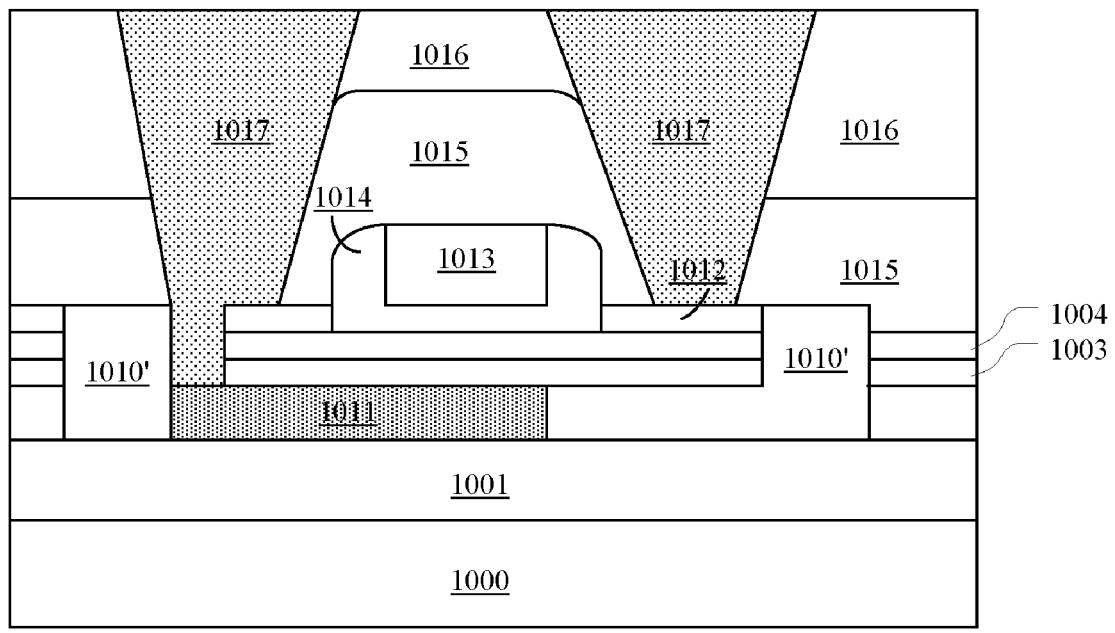
FIG. 11 is a cross-sectional view of the structure after a back-gate contact is formed so as to contact one side surface of the back-gate region in the method for manufacturing the semiconductor structure according to the embodiment of the present invention.

Afterwards, contacts may be formed. Firstly, an asymmetrical contact hole may formed by conventional processes including lithography and reactive ion etching, as shown in FIG. 9. Specifically, the contact hole has one portion that is located outside the source/drain regions and extends to the back-gate region 1011, and has another portion extends to the source/drain regions, so as to expose the silicides. According to one embodiment of the present invention, the portion of the contact hole outside the source/drain region is preferably formed in the shallow trench isolation structure so as to expose one side surface of the back-gate region 1011, which leads to a simple manufacturing process and a lowered manufacture cost. The contact hole is then filled with a conductive material so as to provide a contact 1017 which provides electrical contact between the source or drain region and the back-gate region. The conductive material can be, but not limited to, at least one of Cu, Al, W, polysilicon and other similar conductive materials. Preferably, a contact liner having a thickness of about 1-10 nm may be formed of Ti, TiN or their combination. Note that the contact which extends to the back-gate region is referred as the back-gate contact, and the contact which extends to the surface of the source/drain region is referred as the source/drain contact. Thus, an SOI MOSFET, which has an asymmetric back-gate region 1011 and a common contact for adjusting the threshold voltage, is formed, as shown in FIG. 10. The SOI MOSFET has an increased integration level and a lowered manufacture cost, and has an improved effect of adjusting the threshold voltage and improved device performance. As shown in FIG. 11, the back-gate contact extends to the back-gate region and contacts a top surface of the back-gate region. Preferably, the back-gate contact extends to the back-gate region and contacts one side surface of the back-gate region.

Thus, a semiconductor structure according to one embodiment of the present invention is formed, which comprises: an SOI substrate comprising an SOI layer 1004, a first buried insulating layer 1003, an additional SOI layer 1002, a second buried insulating layer 1001 and a base substrate 1000 from top to bottom; a shallow trench isolation structure embedded in the SOI substrate and located on the second buried insulation layer 1001 to provide an active region; a gate 1013 located in the active region; source/drain regions on both sides of the gate 1013; a back-gate region 1011, which is formed from the additional SOI layer 1002 after resistance reduction, comprising the portion of the additional SOI layer 1002 below the source/drain regions and below the gate; and a contact 1017, wherein the contact 1017 has a portion that is located outside the source/drain regions and extends to the back-gate region 1011, and provides electrical contact between the source or drain region and the back-gate region. Each of the second buried oxide layer 1001 and the first buried oxide layer 1003 may also be other buried insulating layers.

Preferably, the portion of the additional SOI layer below the drain or source region is an isolating dielectric filling region adjacent to the back-gate region.

Preferably, the portion of the contact outside the source or drain region is formed in the shallow trench isolation structure and contacts one side surface of the back-gate region.

Preferably, the semiconductor structure according to the present invention comprises raised source/drain regions on the source/drain regions.

Preferably, source/drain extensions and halos are also formed.

Figure 12:
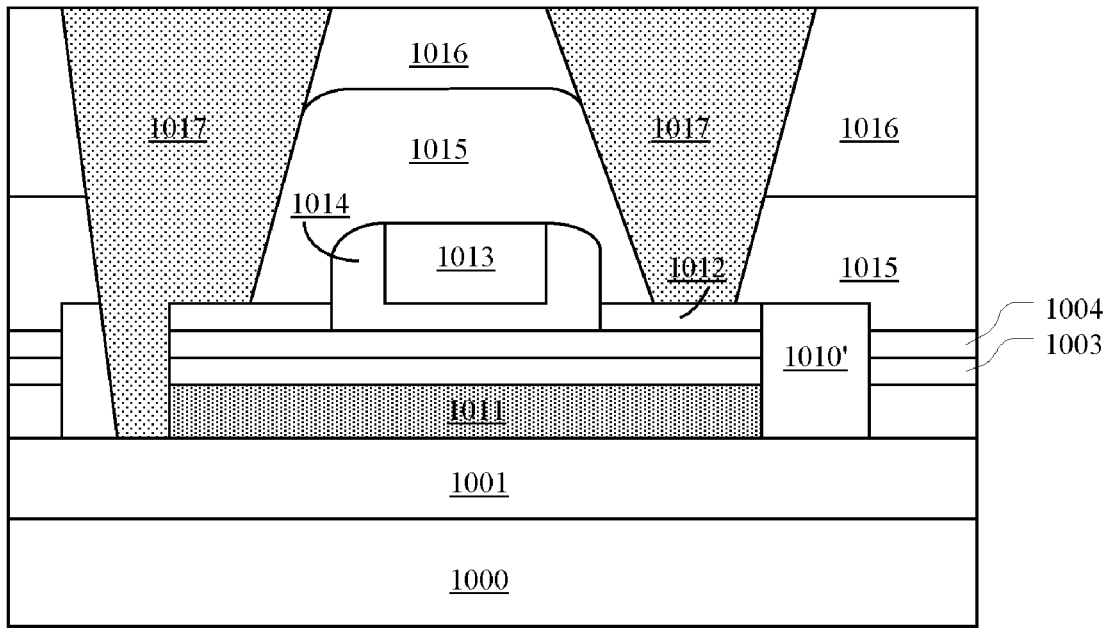
FIG. 12 is a cross-sectional view of the structure after a back-gate contact is formed so as to contact a top surface of the back-gate region in a method for manufacturing the semiconductor structure according to another embodiment of the present invention.
Figure 13:
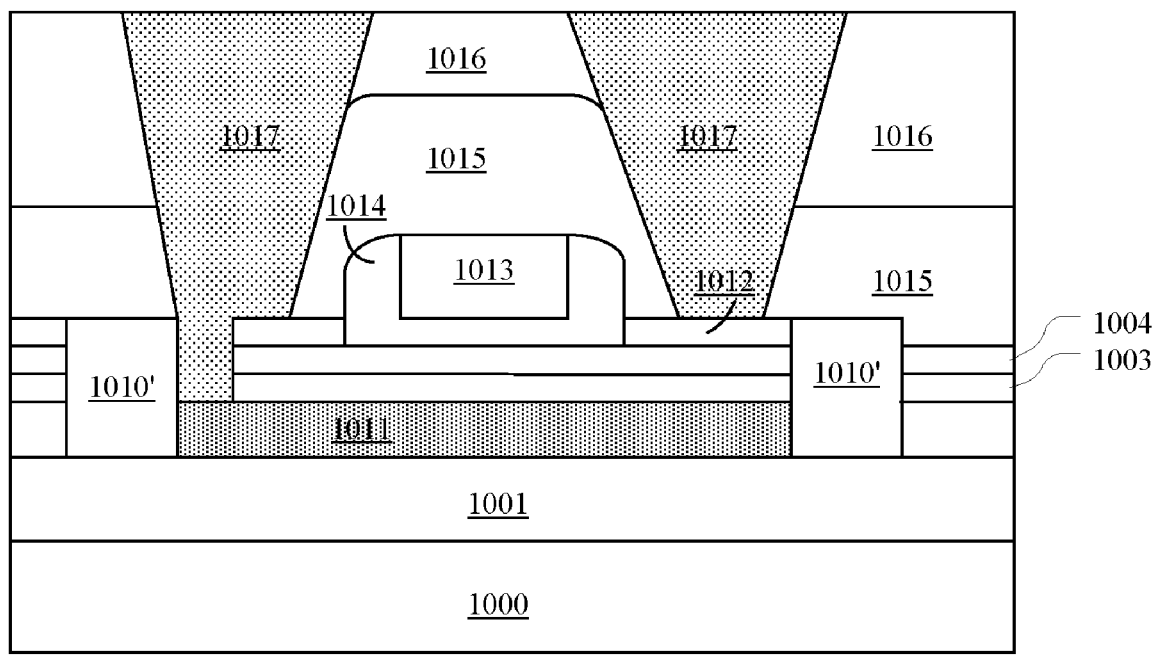
FIG. 13 is a cross-sectional view of the structure after a back-gate contact is formed so as to contact one side surface of the back-gate region in the method for manufacturing the semiconductor structure according to a further embodiment of the present invention.

According to another embodiment of the present invention, the back-gate region can be formed from the additional SOI layer after resistance reduction, as shown in FIGS. 12 and 13. Specifically, an SOI substrate is firstly provided; a shallow trench isolation structure is then formed; and an additional SOI layer is subjected to ion implantation to form an additional SOI layer having a reduced resistance so as to form a back-gate region. The materials and process parameters in the above steps can be those well known by one skilled person in the art. Thus, no details are given here.

In the semiconductor structure, the threshold voltage may be adjusted by the common contact, which leads to a simple manufacturing process, an increased integration level and a lowered manufacture cost. Moreover, the asymmetric design of the back-gate structure further increases the threshold voltage and improves device performance.

In the above description, no details are given for patterning and etching of various layers. Nevertheless, one skilled person will appreciate that the layers and regions having desired shapes can be formed by various approaches well known in the field. Moreover, one skilled person may propose a process completely different from the above processes for providing the same structure.

Various embodiments of the present invention have been described above. It should be understood that they have been presented by way of example, and not limitation on the protection scope of the present invention. The protection scope is defined by the attached claims and their equivalences. One skilled person will readily recognize that various modifications and changes may be made to the present invention without departing from the true scope of the present invention.

The invention claimed is:

1. A semiconductor structure, comprising
   an SOI substrate comprising an SOI layer, a first buried insulating layer, an additional SOI layer, a second buried insulating layer and a base substrate from top to bottom;
   a shallow trench isolation structure embedded in the SOI substrate and located above the second buried insulation layer to provide an active region;
   a gate formed in the active region;
   source/drain regions on both sides of the gate;
   a back-gate region forming by reducing resistance of the additional SOI layer; and
   a contact,
   characterized in that
      the back-gate region comprises at least a portion of the additional SOI layer below the source or drain region and below the gate; and
      the portion of the contact outside the source or drain region extends to the back-gate region to provide a common electrical contact between the source or drain region and the back-gate region.

2. The semiconductor structure according to claim 1, characterized in that the portion of the additional SOI layer below the source or drain region is formed as an isolating dielectric filling region adjacent to the back-gate region.

3. The semiconductor structure according to claim 1, characterized in that the portion of the contact outside the source or drain region is formed in the shallow trench isolation structure and contacts one side surface of the back-gate region.

4. The semiconductor structure according to claim 1, characterized in that it further comprises raised source/drain regions on the source/drain regions.

5. The semiconductor structure according to claim 1, characterized in that the first buried insulating layer and the second buried insulating layer are buried oxide layers.

6. A method for manufacturing a semiconductor structure, comprising:
   providing an SOI substrate which comprises an SOI layer, a first buried insulating layer, an additional SOI layer, a second buried insulating layer and a base substrate from top to bottom;
   forming a shallow trench isolation structure embedded in the SOI substrate and located above the second buried insulation layer to provide an active region;
   forming a back-gate region by reducing resistance of the additional SOI layer;
   forming a gate and source/drain regions on both sides of the gate on the SOI substrate in the active region;

the back-gate region comprising at least a portion of the additional SOI layer below the source or drain region and below the gate; and forming a contact having a portion outside a source or drain region which extends to the back-gate region to provide a common electrical contact between the source or drain region and the back-gate region.

7. The method according to claim 6, characterized in that the step of forming a back-gate region by reducing resistance of the additional SOI layer comprises performing n-type or p-type doping with a doping concentration of about $10^{18}$-$10^{21}$ cm$^{-3}$.

8. The method according to claim 6, characterized in that an isolating dielectric filling region is formed in the region of the additional SOI layer below the source or drain region and adjacent to the back-gate region.

9. The method according to claim 8, characterized in that the step of forming an isolating dielectric filling region comprises:

performing n-type heavily doping to a portion of the additional SOI layer before formation of the shallow trench isolation structure;

forming an isolation trench to expose one side of the n-type heavily doped region;

removing the n-type heavily doped region; and filling with an isolating dielectric.

10. The method according to claim 9, characterized in that the step of performing n-type heavy doping comprises performing ion implantation with As or P.

11. The method according to claim 9, characterized in that the doping concentration is larger than $10^{18}$ cm$^{-3}$.

12. The method according to claim 6, characterized in that the portion of the contact outside the source or drain region extends into the shallow trench isolation structure and contacts one side surface of the back-gate region.

13. The method according to claim 12, characterized in that the step of forming the contact with one side surface of the back-gate region comprises:

forming a contact hole which has a portion extending into the shallow trench isolation structure to expose one side surface of the back-gate region;

filling the contact hole with a conductive material; and performing a planarization process.

14. The method according to claim 13, characterized in that the conductive material is one selected from a group consisting of W, Al, Cu, TiAl, and combinations thereof.

15. The method according to claim 14, characterized in that a liner is formed before filling with the conductive material.

16. The method according to claim 15, characterized in that the material of the liner is one selected from a group consisting of Ta, TaN, Ti, TiN, Ru, and combinations thereof.

17. The method according to claim 16, characterized in that raised source/drain regions are formed on the source/drain regions.

18. The method according to claim 6, characterized in that the first buried insulating layer and the second buried insulating layer are buried oxide layers.

* * * * *

UNITED STATES PATENT AND TRADEMARK OFFICE
CERTIFICATE OF CORRECTION

PATENT NO. : 8,367,490 B2  
APPLICATION NO. : 13/144182  
DATED : February 5, 2013  
INVENTOR(S) : Huilong Zhu et al.

Page 1 of 1

It is certified that error appears in the above-identified patent and that said Letters Patent is hereby corrected as shown below:

In the Specification

Col. 2, Line 42
   Delete "$cm^3$"
   Insert --$cm^{-3}$--

Signed and Sealed this  
Fifth Day of November, 2013

Teresa Stanek Rea  
*Deputy Director of the United States Patent and Trademark Office*